United States Patent [19]
Rost et al.

[11] 4,353,123
[45] Oct. 5, 1982

[54] ULTRASONIC TRANSMITTER

[75] Inventors: Helmut Rost, Uttenreuth; Alfred Walz, Burgthann, both of Fed. Rep. of Germany

[73] Assignee: Siemens Aktiengesellschaft, Berlin & Munich, Fed. Rep. of Germany

[21] Appl. No.: 227,995

[22] Filed: Jan. 23, 1981

[30] Foreign Application Priority Data

Feb. 19, 1980 [DE] Fed. Rep. of Germany ....... 3006106

[51] Int. Cl.³ .......................... G01S 7/52; G10K 11/00
[52] U.S. Cl. ...................................... 367/137; 367/138
[58] Field of Search ................................ 367/137, 138

[56] References Cited

U.S. PATENT DOCUMENTS

| | | | |
|---|---|---|---|
| 4,020,446 | 4/1977 | Iida et al. | 367/138 |
| 4,027,280 | 5/1977 | Beyers, Jr. | 367/137 |
| 4,049,953 | 9/1977 | Evans, Jr. | 367/137 X |
| 4,190,818 | 2/1980 | Follin et al. | 367/138 |

Primary Examiner—Richard A. Farley
Attorney, Agent, or Firm—Hill, Van Santen, Steadman, Chiara & Simpson

[57] ABSTRACT

It is the aim of the exemplary disclosure to create a simple system with as great a variability as possible wherein a pulse generator for each ultrasonic transducer element comprises a digital frequency control member for controlling the pulses to be fed to the transducer element and at which at least the pulse frequency ($f_s$) can be selected by means of an input digital value (FW).

17 Claims, 3 Drawing Figures

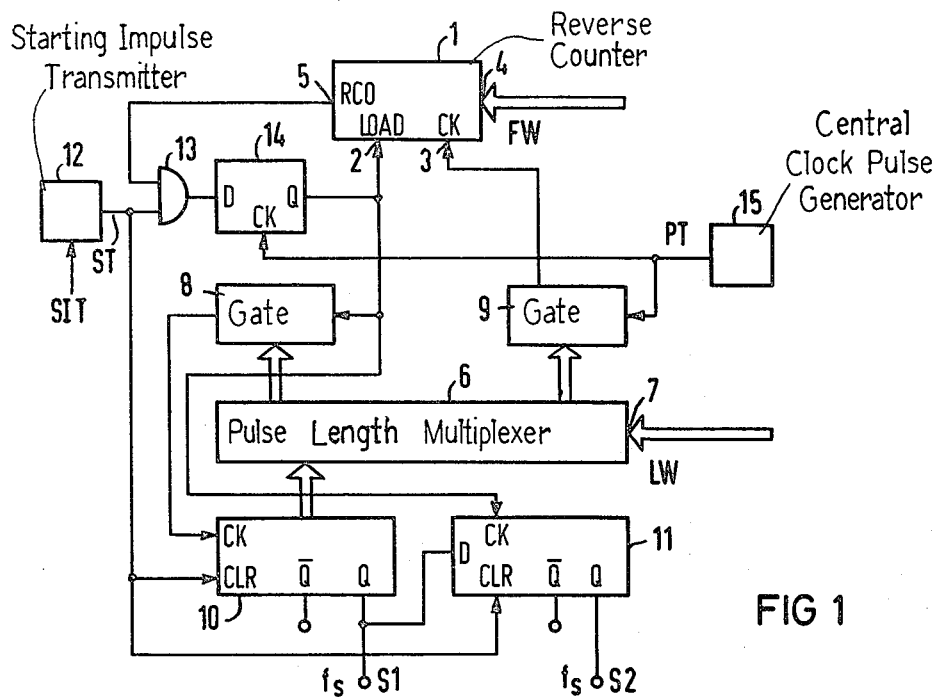
FIG 1
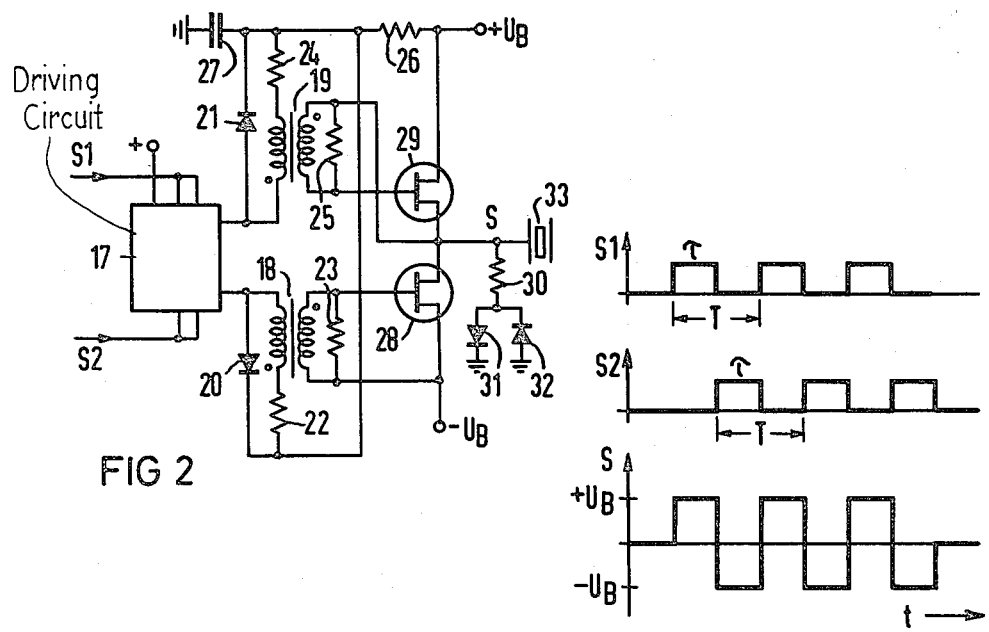
FIG 2
FIG 3

ULTRASONIC TRANSMITTER

BACKGROUND OF THE INVENTION

The invention relates to ultrasonic transmitter circuitry for operating ultrasonic transducers, which circuitry includes a pulse generator for supplying electrical excitation pulses.

Ultrasonic excitation transmitter circuitry of this type should, with respect to the operation of ultrasonic transducers, be designed as versatilely as possible. The circuitry should preferably be applicable not only in a great variety of types of transducer systems, such as, for example, sound heads, with only one or a small number of transducer elements, or whole transducer meshes (so-called arrays); but further in one and the same type of the applied transducer system, quick transfer is desirable to various operational conditions, such as, for example a different transmitting frequency, duration and/or number of the pulses to be emitted during the excitation phase. Especially in phased arrays there is also the desire to be able to make particularly simple adjustment of the delay times, and yet still retain a high degree of accuracy. Conventional devices of all types permit changes in methods of operation in all (as a whole) only by fine tuning individual circuit members by direct intervention in the circuit, or by multiple preparation of individual circuit members or even whole transmitting systems.

SUMMARY OF THE INVENTION

The aim of the invention is to produce a simpler system with greater versatility for ultrasonic transmitters of the type named above.

The aim is achieved according to the invention, in that the pulse generator comprises a digital frequency controlling member, for controlling the pulse rate of the pulses to be supplied to the transducer, in which at least the pulse frequency can be adjusted by means of an input digital value.

The invention permits a simple software-type changeover of the ultrasonic transmitter frequency when necessary; intervention in the "hard-wired" circuitry is not necessary. The ultrasonic excitation transmitter according to the invention therefore presents optimal adaptability in various transducer systems with various frequency requirements. Particularly in the case of fixed arrays, precisely defined delay times are given regarding the delayed onward activation of transducer elements excited one after the other chronologically. The transmitting system is thus optimally designed also in this sense.

In an advantageous embodiment of the invention, corresponding digital control members can be provided for other parameters of the excitation pulses. Thus, in addition to the frequency control member, a second digital control member, amongst others, can also be present, in which the number of pulses to be fed to a transducer within an excitation phase, and therefore also the total duration of an excitation pulse, can be adjusted by means of an input digital value. If necessary, a third digital control member can also be included, in which the pulse-duty factor can be preselected on the basis of an input digital value.

Further advantages and details of the invention will be apparent from the description, below, of an exemplary embodiment illustrated on the accompanying drawing sheet, and from the features of the subclaims.

BRIEF DESCRIPTION OF THE DRAWINGS

FIGS. 1 and 2 illustrate the invention by means of basic circuit diagram; and

FIG. 3 shows an impulse diagram of significant voltage pulse sequences, for illustrating the operation of the circuitry of FIGS. 1 and 2.

DETAILED DESCRIPTION

In FIG. 1, a programmable reverse (count-down) counter is designated by reference numeral 1, which includes two onward control inputs 2 and 3 and a programming input 4 for input of the desired frequency of the excitation impulses in the form of a digital value FW. At a signal output 5, each time the reverse counter passes through zero, an overflow impulse is emitted, whose pulse rate is a function of the digital input frequency value FW. The component 6 represents a pulse-length multiplexer. At input 7 of component 6, the number of pulses to be allocated altogether to a transmitting pulse is controlled, again in the form of a digital input value (address LW). The number of pulses as digitally selected at LW then determines the total length of the excitation impulse. In the shown interconnection, electronic gates 8 and 9, divider flip-flops 10 and 11, and a starting stage consisting of starting impulse transmitter 12, AND-gate 13 and synchronizing flip-flop 14, are associated with both components 1 and 6. Synchronization proceeds via the pulse rate PT of a central pulse rate generator 15. The pulse sequences S1(t) and S2(t) resulting at the outputs Q of the divider flip-flops 10 and 11 are phase-shifted relative to each other preferably by a pulse duration $\tau$. They then have e.g. the waveforms shown in the diagram of FIG. 3 with the pulse duty factor of 1.1. Thus in FIG. 3, waveforms S1(t) and S2(t) each have equal "on" and "off" intervals, each such interval having a time duration $\tau$, equal to one-half the total period T of each waveform, and the waveforms being offset in phase by T/2. These pulses are finally supplied to a push-pull output stage according to FIG. 2. The push-pull output stage comprises on the input side a driving circuit 17, which is followed on the output side by two transistors 28, 29 in push-pull arrangement, preferably V MOS field effect transistors, via two circuits formed by toroidal core broad-band transformers 18 and 19, diodes 20 and 21, ohmic resistors 22 to 26 and a capacitance 27. On account of the push-pull control of these transistors 28 and 29, a square-wave voltage S(t), FIG. 3, results with an amplitude alternating between $+U_B$ and $-U_B$. This square-wave voltage S is then finally supplied to an ultrasonic transducer 33 via an output network formed by an ohmic resistor 30 and oppositely poled diodes 31 and 32.

As already mentioned above, in the case of the ultrasonic transducer 33, a single transducer element may be involved, which emits and receives impulses (e.g. for A-scan-operation). In the illustrated embodiment, however, the transducer 33 is to be, in particular, a single transducer element of a whole transducer mesh (array) for B-scan e.g. that of a phased array. Depending upon the total number of all transducer elements of the array arranged next to each other or even one on top of the other in lines in matrix form, a corresponding number of transmitting stages is then necessary according to the form described here. In the case of application in a phased array, the variable delay times are determined in the simplest way, in that simply the times of applying starting impulses to the starting impulse transmitter 12 of each transmitter stage are selected so as to follow at variable intervals. Thus the delay times are as simple as possible and can be exactly reproduced at any time. In respect of the pulse waveforms of the diagram in FIG. 3, the pulse duration τ amounts preferably to half the wavelength (λ/2) of the useful excitation oscillation S(t), FIG. 3, for a transducer element. With the selected pulse duty factor of 1:1, the symmetrical square-wave pulse waveform S(t) according to FIG. 3 then corresponds exactly to the fundamental wave of the transducer as regards frequency, after sine-shaped obliteration at the respective transducer element. The transducer is thus stimulated at its useful resonant frequency; the harmonic content scarcely has any further effect. The excitation transmitter according to the invention thus brings about a relatively narrow-band excitation of the transducer element. As a consequence, the selected pulse-duty factor of 1:1 with λ/2 as pulse duration creates a transmitting system with particularly high efficiency. Naturally, other pulse-duty factors are also possible e.g. by variation of FW during the set-up of a transmitting pulse sequence; however, they generally lead to a widening of the frequency range.

The method of function of the invention according to the exemplary embodiment shown in FIGS. 1 to 3 can be summarized as follows:

Before the device is set into operation, the desired frequency is input as a digital value FW at the input 4 of the programmable countdown counter 1. Correspondingly, an address word LW for the pulse number and therefore the total length of an excitation impulse is supplied to the multiplexer 6. To initiate a transmitting process, a starting impulse ST is then set by means of a starting impulse transmitter 12, which is coupled to the input D of flip-flop 14 via the AND circuit 13. The pulse sequence PT of the central clock pulse generator 15 is connected at the same time to the CK-input. With the occurrence of the first pulse PT of this central pulse generator, and the previous transmission of the starting inpulse, a synchronized starting impulse is transmitted to the control input 2 (LOAD) of the countdown counter 1 at the output Q of the flip-flop 14. Thereupon, the count-down counter 1 programs itself with the frequency word FW (e.g. in binary digital format) connected to the input 4 thereof. Once programming is concluded, then the reverse counting of the countdown counter also begins at the clock pulse rate of the impulses PT of the central clock pulse generator 15, which are supplied to the control input 3 (CK) of the countdown counter 1 via the open gate 9. The countdown counter 1 finally passes through the zero position after counting the programmed-in number of FW clock pulses, whereupon an overflow-impulse is produced at the output 5 (RCO). This overflow impulse is transmitted to the input D of the flip-flop 14 via the AND-gate 13. Corresponding to the previous starting impulse ST, this new pulse is synchronized with the next pulse PT of the clock pulse generator 15 and is supplied as an additional LOAD-impulse to the control input 2 of the countdown counter 1. The countdown counter 1 thus reprograms itself again with the value FW and the process of counting down to zero is repeated with a renewed feedback of an overflow impulse, as already described above.

This continues until a blocking impulse is supplied by the multiplexer 6 to the gate 9. The time of the occurrence of such a blocking impulse is determined by the last occurrence of a pulse of the number of individual pulses of the excitation impulses, preselected by means of the address word LW. If for example, the number of pulses, as shown in FIG. 3, is preselected as LW equal to 3, then the gate 9 is closed by the multiplexer 6 after the occurrence of the third impulse. No further clock pulses PT of the clock pulse generator 15 can then reach the control input 3 of the counter, whereupon the reverse counting process is stopped. Renewed initiation is brought about again only by a new starting impulse ST at the output of the starting impulse transmitter 12. In addition the multiplexer 6 also controls a second electronic gate 8 for the LOAD-impulses of the synchronizing flip-flop 14 of the input starting stage, in dependence on the selected pulse number LW and on the position of the divider flip-flops 10 and 11 on the output side. The gate 8 is opened by the multiplexer 6 at the moment when, from the input CLR, divider flip-flops 10 and 11 are set at zero at the outputs Q at the same time as the setting of a starting impulse. The gate 8 then continues to be open for LOAD-signals until a closing impulse is also supplied to the gate 8 by the multiplexer 6 at the end of the last pulse of the input pulse number. While the divider flip-flop 10 is now immediately blocked for LOAD-impulses, the divider flip-flop 11 receives yet another final LOAD-impulse via the direct connection to the input CK. Thus the phase-shifted pulse sequences S1 and S2 according to FIG. 3, limited to three pulses, appear at the outputs Q in the case of e.g. the preselected number LW=3. These pulse sequences are then finally converted into the square wave signal S(t) at the push-pull stage according to FIG. 2 in the way already described above.

According to the invention, the value FW for the frequency is a digital value. However, from this digital value FW, the transmitting pulse frequency is then formed at the outputs of the divider flip-flops 10 and 11, in connection with the central clock pulse rate PT as follows:

$$f_s = \frac{PT}{2(FW+1)}$$

If, for example, the central clock pulse rate is selected as PT=20 MHz, and for FW, the digital value for the number 4 is stored, then the transmitting frequency is set to $f_s=2$ MHz according to the above equation. Different transmitting frequencies $f_s$ result accordingly for different values of FW.

In the exemplary embodiment of FIGS. 1 to 3, the starting impulse transmitter 12 can supply its starting impulse ST directly and immediately (undelayed) in the desired transmission clock pulse rate of transmitting impulses. Normal, undelayed transmitting operation then results, for example, for a single transducer or transducer array. Delay must be carried out insofar as focussing is to be effected; for example, in the case of a phased array. To this end, as already mentioned, the starting impulses for the individual transducer elements of the array are to be prescribed in chronological sequence, variably according to a specific time profile. In the latter case, in particular, the starting impulse transmitter 12 is then preferably a program transmitter for such a time profile, it thus has an input SIT for the actual transmitting impulse timing and forms internally, corresponding to the stored delay program, the variable delay times for the time-displaced transmission of starting impulses ST after the occurrence of associated transmitting clock impulses SIT. The clock pulse SIT can be derived selectively from a separate impulse transmitter or also from the central clock pulse generator 15 mentioned already. Corresponding to the impulse progression of FIG. 3, the square wave impulses of the transmitting pulse voltage S(t) have the same amplitudes. In modification of the exemplary embodiment, however, an amplitude variation can be undertaken in the simplest way according to a preselectable profile in that the operational voltage ±UB of the push-pull output stage is designed variably. Through the selection of a suitable amplitude variation, minor lobe effects in particular can be considerably suppressed. The example of operation permits, in practice, frequency changes in the range of 100 kHz to 10 MHz in the case of a supply voltage of between ±50 V. It can therefore be optimally applied to all transducer systems used presently.

It will be apparent that many modifications and variations may be effected without departing from the scope of the novel concepts and teachings of the present invention.

SUPPLEMENTARY DISCUSSION

By way of example, it will be apparent to those skilled in the art that pulse length multiplexer 6 may be comprised of a binary counter chain and a comparator which may unlatch gates 8 and 9 at count values corresponding to an input binary digital value LW. Thus if counter 1 counts down to zero in response to five pulses PT, then waveform S, FIG. 3, may have a total duration (measured from the ordinate axis) corresponding to thirty-five pulses PT. Thus with input LW of multiplexer 6 set at a binary value corresponding to thirty-five, gates 8 and 9 could be unlatched and rendered non-transmissive after a count is reached in component 6 of thirty-five pulses PT. If desired, gate 8 could be unlatched at a separate digital input value, e.g. LW' of thirty which could be set in conjunction with a second comparator stage associated with the same counter of component 6.

Similarly, it will be apparent that each of the waveforms S1 and S2 may have an "on" time of $\tau_A$ clock pulses different from its "off" time of $\tau_B$ clock pulses by alternately introducing into counter 1, respective count values $(\tau_A - 1)$ and $(\tau_B - 1)$ for alternate countdown to zero (in place of a single input count value FW).

We claim:

1. An ultrasonic transmitter for operating ultrasonic transducers, said transmitter comprising a pulse generator for supplying excitation pulses, the pulse generator comprising a digital frequency control member (1) for controlling the pulses to be supplied to an ultrasonic transducer element, said digital frequency control member (1) having circuit means whereby at least the pulse frequency (fs) is selectable in response to an input digital value (FW), and said circuit means comprising a second digital control member (6) responsive to a second input digital value (LW) to determine the number of pulses to be supplied to an ultrasonic transducer element within an excitation phase, thereby also to determine the total duration of an excitation of such ultrasonic transducer element.

2. An ultrasonic transmitter according to claim 1, with said circuit means being operable to generate individual pulse waveforms (S1, S2) with variable pulse duty factor and for combining said individual pulse waveforms to form an excitation signal (S) for supply to an ultrasonic transducer element, said circuit means being responsive to a digital input to set the pulse duty factor of said individual pulse waveforms (S1, S2).

3. An ultrasonic transmitter according to claim 1, with said circuit means being operable to supply a rectilinear waveform pulse sequence (S(t)) which is generated with a limited number of impulses of rectilinear waveform, in dependence on the digital values which can be input to said circuit means.

4. An ultrasonic transmitter according to claim 3, with said circuit means including a push-pull stage (17 to 32), and means for supplying to said push-pull stage two asymmetrical pulse waveform signals (S1(t), S2(t)), which are offset in phase relative to each other.

5. An ultrasonic transmitter according to claim 4, with said circuit means being operable in conjunction with said digital frequency control member (1) to select a pulse duration ($\tau$) of the asymmetrical pulse waveform signals, and to supply the pulse waveform signals with the selected pulse duration ($\tau$) to said push-pull stage (17 to 32) so as to generate alternating polarity excitation with a wavelength equal to a fundamental resonant wavelength of a transducer element which is to receive such excitation.

6. An ultrasonic transmitter according to claim 5, with said circuit means being operable to select a pulse duty factor of 1:1 for the asymmetrical pulse waveform signals.

7. An ultrasonic transmitter according to claim 1, with said digital frequency control member comprising a programmable counter (1) having an input (4) for receiving the input digital value (FW), said counter (1) being responsive to a starting impulse to enter a count value in accordance the input digital value (FW) and for thereafter emitting a counting signal each time a number of counts corresponding to such count value is received by said counter.

8. An ultrasonic transmitter according to claim 1, with said second digital control member (6) comprising a pulse length multiplexer having an address input for receiving the second input digital value (LW), said multiplexer being operable to supply an output with a timing for determining the number of pulses to be supplied to an ultrasonic transducer element within an excitation phase in accordance with the second input digital value (LW) at the address input thereof.

9. An ultrasonic transmitter according to claim 1, with said digital control member comprising a programmable counter, a central clock pulse generator (15) supplying pulses to the programmable counter (1) at a pulse rate, PT, for effecting counting action of said programmable counter (1), said programmable counter (1) being responsive to an input digital value, FW, to divide the input pulse rate, PT, by a factor FW plus one, such that a pulse frequency which is a function of PT/(FW+1) is supplied by said programmable counter.

10. An ultrasonic transmitter for operating ultrasonic transducers, said transmitter comprising a pulse generator for supplying excitation pulses, the pulse generator comprising a digital frequency control member (1) for controlling the pulses to be supplied to an ultrasonic transducer element, said digital frequency control member (1) having circuit means whereby at least the pulse frequency (fs) is selectable in response to an input digital value (FW), said digital frequency control member comprising a programmable counter (1) having an input (4) for receiving the input digital value (FW), said counter (1) being responsive to a starting impulse to enter a count value in accordance with the input digital value (FW) and for thereafter emitting a counting signal each time a number of counts corresponding to such count value is received by said counter, said circuit means comprising a second digital control member (6) responsive to a second input digital value (LW) to determine the number of pulses to be supplied to an ultrasonic transducer element within an excitation phase, thereby also to determine the total duration of an excitation of such ultrasonic transducer element, said second digital control member (6) comprising a pulse length multiplexer having an address input for receiving the second input digital value (LW), said multiplexer being operable to supply an output with a timing for determining the number of pulses to be supplied to an ultrasonic transducer element within an excitation phase in accordance with the second input digital value (LW) at the address input thereof, said circuit means further comprising electronic gate means (8, 9) controlled by said pulse length multiplexer (6), synchronizing flip-flop means (14) having an output coupled with the programmable counter (1) for responding to a starting impulse to enter a count value in the programmable counter (1) in accordance with the input digital value (FW), logic gate means (13) having a first input coupled with said programmable counter (1) for receiving counting signals therefrom, and having a second input, and having an output coupled with said synchronizing flip-flop means (14), starting circuit means coupled with the second input of said logic gate means (13) for supplying the starting signal to the programmable counter (1) under the control of said logic gate means (13) and said synchronizing flip-flop means (14), divider flip-flop means (10, 11) coupled with said synchronizing flip-flop means (14) so as to generate first and second rectangular waveform signals with a pulse duration ($\tau$) in accordance with the input digital value (FW) supplied to the input (4) of said programmable counter (1) until terminated in accordance with the second input digital value (LW) at the address input of said pulse length multiplexer (6), said electronic gate means (8, 9) controlling the number of pulses of said first and second rectangular waveform signals so as to control the duration of an excitation phase, and means coupled with said divider flip-flop means (10, 11) for combining the first and second rectangular waveform signals to form an alternating polarity excitation signal for supply to an ultrasonic transducer element.

11. An ultrasonic transmitter according to claim 10, with the programmable counter being a countdown counter (1) with counting stages for receiving a count value in accordance with the input digital value (FW) and for counting down to zero in response to pulses supplied thereto via said electronic gate means (9), said countdown counter (1) actuating said synchronizing flip-flop means (14) via said logic gate means (13) upon reaching a zero count value to thereby actuate said divider flip-flop means (10, 11).

12. An ultrasonic transmitter according to claim 10, with a central clock pulse generator (15) coupled with said synchronizing flip-flop means (14) so as to synchronize the starting impulse supplied to said programmable counter (1) with the operation of said central clock pulse generator (15).

13. An ultrasonic transmitter according to claim 10, with a central clock pulse generator (15) coupled with said programmable counter (1) via said electronic gate means (9) for supplying pulses to the programmable counter for the duration of an excitation phase.

14. An ultrasonic transmitter according to claim 13, with said electronic gate means comprising a first electronic gate (9) interposed between said central clock pulse generator (15) and the programmable counter (1), and a second electronic gate (8) interposed between said programmable counter (1) and said divider flip-flop means, said divider flip-flop means comprising a first divider flip-flop (10) for generating the first rectangular waveform signal and coupled with said programmable counter (1) via said second electronic gate (8) such that the first rectangular waveform is terminated under the control of said pulse length multiplexer (6) via said second electronic gate (8), and a second divider flip-flop (11) coupled with the first divider flip-flop for generating a second rectangular waveform signal out of phase with said first rectangular waveform signal.

15. An ultrasonic transmitter according to claim 14, with the synchronizing flip-flop means (14) being coupled with the second divider flip-flop means (11) such that the second divider flip-flop (11) supplies a final pulse of the second rectangular waveform signal after the termination of the first rectangular waveform signal by the second electronic gate (8).

16. An ultrasonic transmitter for operating ultrasonic transducers, said transmitter comprising a pulse generator for supplying excitation pulses, the pulse generator comprising a digital frequency control member (1) for controlling the pulses to be supplied to an ultrasonic transducer element, said digital frequency control member (1) having circuit means whereby at least the pulse frequency (fs) is selectable in response to an input digital value (FW), said digital frequency control member comprising a programmable counter (1) having an input (4) for receiving the input digital value (FW), said counter (1) being responsive to a starting impulse to enter a count value in accordance the input digital value (FW) and for thereafter emitting a counting signal each time a number of counts corresponding to such count value is received by said counter, said circuit means comprising a second digital control member (6) responsive to a second input digital value (LW) to determine the number of pulses to be supplied to an ultrasonic transducer element within an excitation phase, thereby also to determine the total duration of an excitation of such ultrasonic transducer element, said second digital control member (6) comprising a pulse length multiplexer having an address input for receiving the second input digital value (LW), said multiplexer being operable to supply an output with a timing for determining the number of pulses to be supplied to an ultrasonic transducer element within an excitation phase in accordance with the second input digital value (LW) at the address input thereof, said circuit means further comprising digital circuit means (10, 11) for generating respective pulse signals (S1, S2) of offset phase, and push-pull circuit means (17–32) coupled with said digital circuit means (10, 11) for receiving the respective pulse signals (S1, S2) and for combining the same to provide an alternating pulse sequence (S) for supply to an ultrasonic transducer element, with the alternating pulse sequence being symmetrical relative to a zero base line.

17. An ultrasonic transmitter according to claim 16, with the digital circuit means comprising divider flip-flops (10, 11) for generating pulse signals (S1, S2) each with pulses of equal duration ($\tau$), and with an offset in phase therebetween of said duration ($\tau$).

* * * * *